June 30, 1970 H. R. GATES 3,518,506
SEMICONDUCTOR DEVICE WITH CONTACT METALLURGY
THEREON, AND METHOD FOR MAKING SAME
Filed Dec. 6, 1967 7 Sheets-Sheet 1

PRIOR ART

INVENTOR
HARLAN R. GATES
BY George O. Saile
ATTORNEY

June 30, 1970 H. R. GATES 3,518,506

SEMICONDUCTOR DEVICE WITH CONTACT METALLURGY
THEREON, AND METHOD FOR MAKING SAME

Filed Dec. 6, 1967 7 Sheets-Sheet 6

United States Patent Office 3,518,506

Patented June 30, 1970

3,518,506
SEMICONDUCTOR DEVICE WITH CONTACT METALLURGY THEREON, AND METHOD FOR MAKING SAME

Harlan R. Gates, Wappingers Falls, N.Y., assignor to International Business Machines Corporation, Armonk, N.Y., a corporation of New York Filed Dec. 6, 1967, Ser. No. 688,466
Int. Cl. H01l 1/14
U.S. Cl. 317—234 24 Claims

ABSTRACT OF THE DISCLOSURE

A semiconductor device having contact metallization thereon designed for high reliability and stability, and capable of high current carrying capacity, comprising a current-distributing metallization layer contacting the active areas of said device through a first insulating layer, a second metallization layer contacting the current-distributing layer through a second insulating layer, a third metallization layer contacting said second metallization layer through a third insulating layer, external contact being made to the third metallization layer. The first two metallization layers may be aluminum, the final layer a series of layers, such as chrome-nickel-gold, and the insulating layers may be $SiO_2$.

FIELD OF THE INVENTION

A barrier layer device and method for making same including the affixing of electrical contact thereto where such contact forms an integral part of said device, i.e., the device and its contact constitute a unitary assembly.

DESCRIPTION OF THE PRIOR ART

As semiconductor technology has progressed, the size of semiconductor devices has physically decreased while the power demands placed upon such devices have been increased. Simultaneously, the amount of circuitry placed upon these ever decreasingly sized devices has increased. This combination of small size, high power, and increased complexity created many problems in the art of distributing electrical current to the active areas of such semiconductor devices. A concurrent problem has been that of protecting the device itself from corrosion and contamination from contact with, for example, corrosive or humid atmospheres.

Various prior art methods of solving the above problems include generally the placing of a glass insulating layer upon the surface of the semiconductor device, and attaching external contact leads, such as aluminum films, through this glass insulating layer to the active areas beneath said layer. This solution solves some of the above problems, but introduced other problems. For example, when high current levels were required within the device, the aluminum films contacting the active areas became subject to burnout failure. When such burnout would occur, the device would have an electrical open and would fail. Attempts to reduce the current density through a given contact to a single area of a device by making a series of multiple contacts to that area of the device or using larger cross-section aluminum films partially relieved the problem, but high current densities persist, leading to eventual burnout of those contacts.

Such burnout was also accelerated by galvanic corrosion between the external contact and any intermediate metallurgy contacting the active area of the device. Cracks in the glass at the contact areas, from stress for example, in a humid atmosphere under normal bias conditions, lead to formation of a galvanic cell, leading to galvanic corrosion and an increase in electrical resistance at the contact area, which accelerated burnout at high current densities or ultimately caused failure even without high current density. Further, once a crack started in the protective glass layer, it often propagated through to the device itself, exposing areas of the device to corrosion via a high humidity or corrosive atmosphere condition.

These problems were accentuated when, for example, external contact metallizations were placed over or within the boundaries of high junction perimeter-to-area ratio comb-like active areas. Structures of this kind are required in order to obtain good performance of many devices, particularly in high current, high frequency amplification or switching.

Thus, the continued use of high powered devices under the more severe conditions of modern day technology requires an increase in reliability of the contact means used to connect the active areas of a semiconductor device to external means. Such contact means should have the desired properties of minimizing or eliminating galvanic corrosion; minimizing or eliminating crack propagation through any insulating layers; minimizing areas of high current density in conducting lands; allow a redundancy in conducting paths having high current densities; allow redundancy of contact wherever possible to minimize device loss through failure of a single contact; and preferably achieve the above in an economically feasible manner.

SUMMARY OF THE INVENTION

These and other problems of the prior art are overcome by the method and device of this invention. Briefly stated, this invention comprises a series of protective insulating layers and electrical contact layers interspersed over the active areas of a semiconductor device. This series of layers acts to minimize stress at the contact regions, limit crack propagation, limit galvanic corrosion, and distribute current in such a manner as to provide redundancy in areas of high current density. This invention further provides a method and structure for distributing current to provide an alternate, shunting current path in high current density areas and limit current density, where no such alternate paths exist, to acceptable values. In series, these layers comprise a current-distributing metallization layer distributed over an active area, such as a high perimeter/area ratio emitter enclosed within a base region, deposited through openings in an insulating layer over the active areas; a second insulating layer over the device; a second metallization layer deposited through openings in the second insulating layer, contacting the current-distributing metallization layer; a third insulating layer over the device; and a third metallization layer deposited through openings in the third insulating layer, contacting the second metallization layer. External contact to the device is made by contacting the third metallization layer.

It is an object of this invention to increase the reliability of semiconductor devices by minimizing crack propagation through the protective layers of said device in an improved manner.

A further object of this invention is to increase the reliability of semiconductor devices by eliminating or minimizing, in an improved manner, galvanic corrosion at the electrical contact areas of said devices.

Yet another object of this invention is to increase in an improved manner the reliability of semiconductor devices operating at high current levels by eliminating areas of high current density in metallization layers over an insulating layer.

Still another object of this invention is to increase the reliability of semiconductor devices in an improved manner by eliminating device failure through the mechanism of metal electromigration, by a series of redundant connections to high current areas.

A further object of this invention is to increase in an improved manner the reliability of semiconductor devices utilizing high perimeter/area ratio junction boundary areas by limiting high current densities to paths having built in redundancy while distributing current uniformly throughout such areas.

These and other objects of the invention will best be understood by reference to the accompanying drawings and the following description of the method and device of this invention.

BRIEF DESCRIPTION OF THE DRAWINGS

FIG. 3 shows a semiconductor substrate surface with an area in which a base layer is diffused.

FIG. 4 shows an area of emitter diffusion within the base area, and a surrounding guard ring diffusion within the surface of the semiconductor substrate.

FIG. 5 shows a metallization contact area within the emitter and base areas and guard ring of said substrate.

FIG. 6 shows the area encompassed by the current-distributing metallization layer.

FIG. 7 shows the contact areas through an insulating layer, prior to the next metallization step.

FIG. 8 shows the area of metallization of the second layer metallization.

FIG. 9 shows the contact areas between the second metallization layer and a future third, external contact metallization layer through an insulating layer.

FIG. 10 shows the area of the third, external contact metallization layer.

FIG. 11 shows the area covered by solder-coated copper ball contacts to make external contact to the external contact metallization layer.

GENERAL DESCRIPTION

Figure 10:
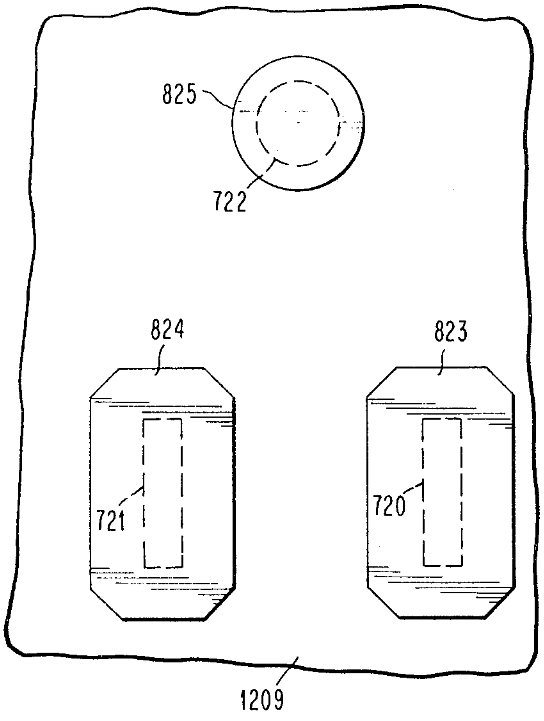
Figure 11:
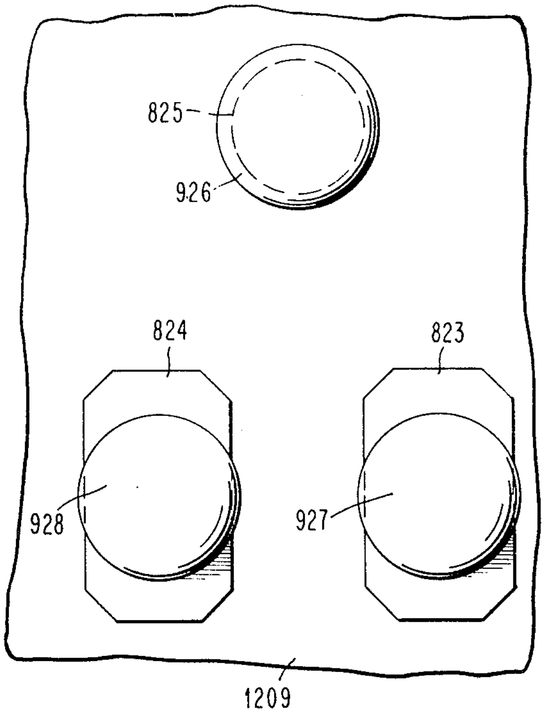
Figure 12:
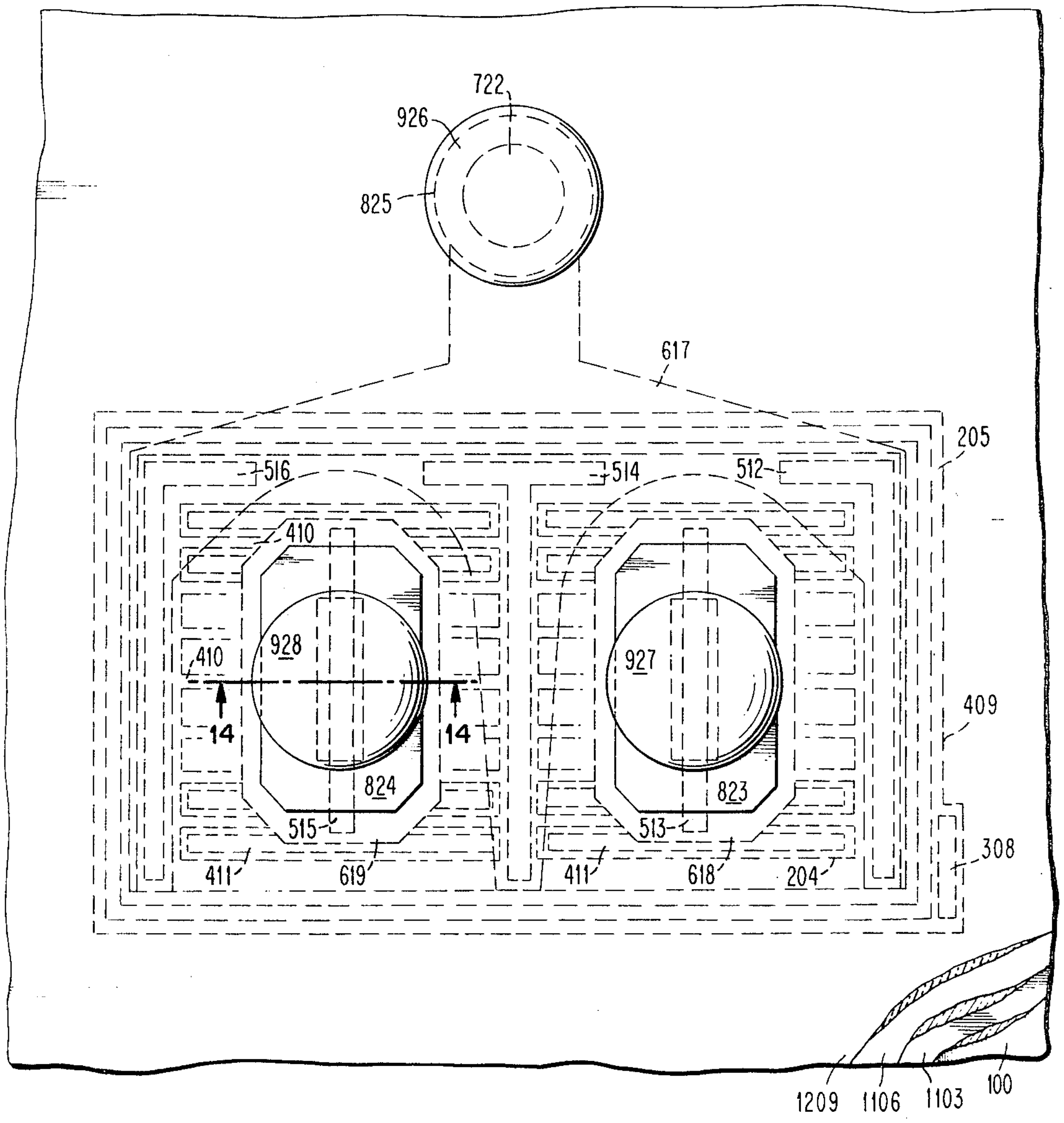
FIG. 12 represents a partial overlay of FIGS. 1–9 showing the relationship of each successive layer.

The semiconductor device and contact metallization of this invention is best understood through an understanding of the method by which the device, including contact metallization is made. FIGS. 3–11 show the step by step method of this invention. In FIGS. 4–11, the dotted line in each figure represents the immediately preceding step. The solid line represents what is done at that particular step. Hence, FIGS. 3–11 essentially constitute an overlay diagram of successive steps. FIG. 12 represents a partial overlay of FIGS. 3–11. The figures are so numbered that the first digit of each number represents the step involved. Thus, number 210, for example, represents something done during the second step.

While the method shown below is for an n-p-n transistor built upon a silicon substrate, it will be clear that this invention is applicable to diodes, as well as multi-junction devices, and to other semiconductor materials.

Figure 3:
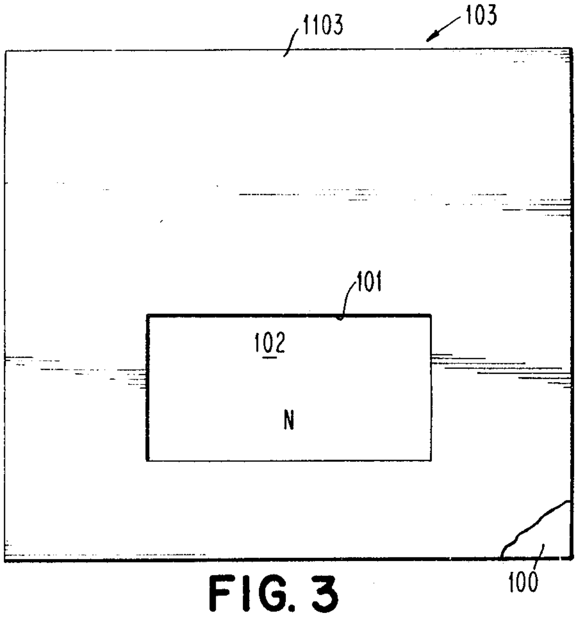
FIGS. 3–11 represent successive steps in the method of making the device of this invention.

FIG. 3 shows a semiconductor substrate 103, such as n-type silicon, with an n-type epitaxial layer 100 grown thereon. A thermal oxide layer is grown upon the epitaxial layer 100, and etched to expose an area 102 enclosed by boundary line 101 for the diffusion of a p-type base region. A p-type base region is then diffused into the area 102 through any of well-known techniques, such as the capsule diffusion technique. As a dopant, boron, for example, may be diffused in a concentration $10^{18}$–$10^{19}$ atoms per cubic centimeter.

Figure 4:
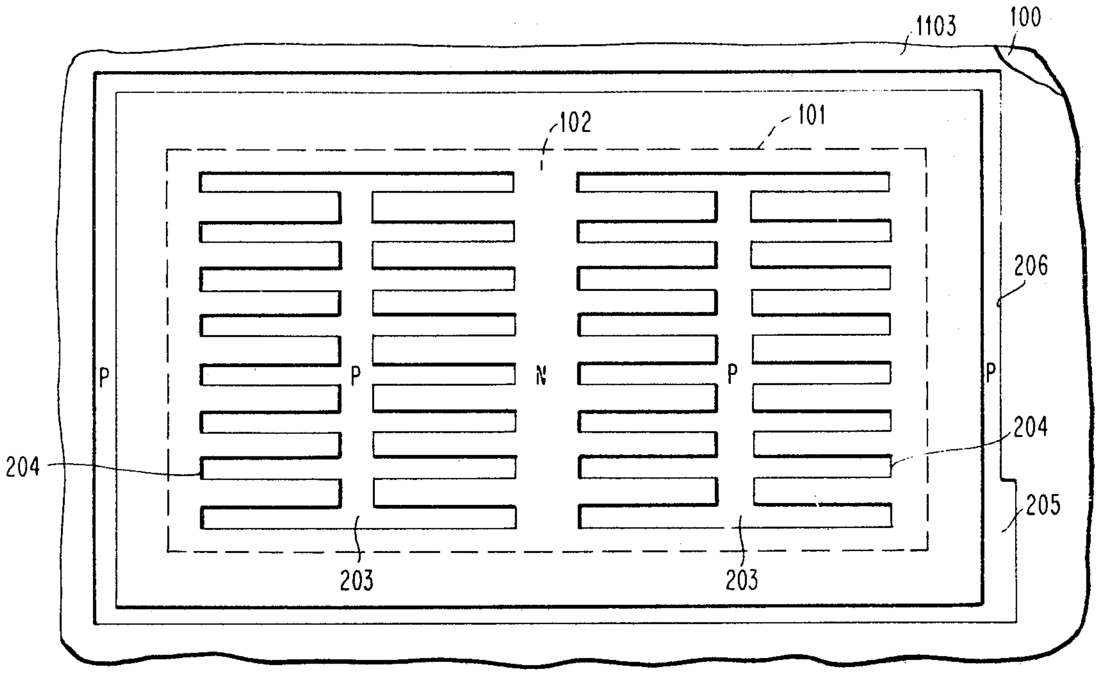

Next, the thermal oxide is regrown over the p-type base region delineated by the line 101. Referring to FIG. 4, an area 203 delineated by line 204 is exposed through the thermal oxide over the base layer by any of the known techniques, such as etching. Similarly, an area 205 delineated by line 206 is exposed in the thermal oxide over the epitaxial layer 100.

An n+ type region is now diffused into the p-type base, utilizing well known techniques again, the diffusion being, for example, of phosphorus, in a concentration of $10^{21}$ atoms per cubic centimeter. Thus, an emitter region 203 delineated by line 204 is placed in the base region delineated by line 101. This emitter region is preferably in the shape of a multiple-finger I-comb configuration having a high perimeter/area junction boundary region. Similarly, an n+ region is diffused into the n+ epitaxial layer in the area 205 delineated by line 206. During this step, a 400–500 angstrom layer of gold previously placed on the back side of the substrate may be diffused into the substrate for lifetime control of minority carriers.

The area 205 delineated by line 206 represents a guard ring diffusion. This is for increased device reliability to prevent the spread of an inversion layer along the surface of the substrate. This effect is well known in the art, and while successive steps involving the guard ring are shown, no further discussion of the guard ring will be necessary. While the guard ring is shown, it will be clear that the invention of this disclosure may be practiced without the incorporation of such a guard ring.

Next, the substrate is re-oxidized thermally. Due to the phosphorus diffusion in the example illustrated, the thermal oxide covering the entire surface of the epitaxial layer 100 may contain a phosphosilicate glass as well as silicon dioxide from the initial thermal oxidation.

A layer of an insulator, known as the first deposited insulating layer, is now deposited over that side of the substrate on which the epitaxial layer 100 was grown, to be known as the first side of the semiconductor substrate material. While a number of insulating materials may be utilized, it is preferable to use silicon dioxide, deposited by any of the known techniques such as sputtering, vapor deposition, etc., and preferably to a thickness between 1,000 to 1,500 angstroms. The use of silicon dioxide glass upon a previously thermally grown silicon dioxide layer allows an excellent matching of thermal expansion characteristics of the glasses, excellent adhesion between glass layers, and protects the phosphosilicate glass layer during subsequent steps.

Figure 5:
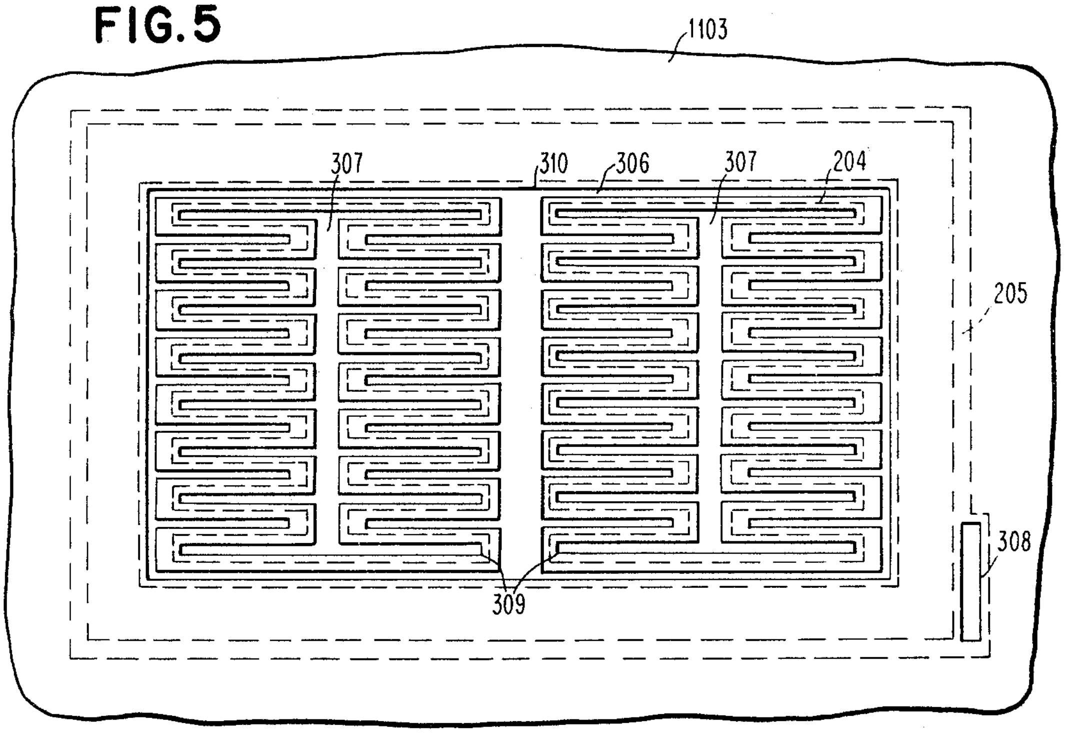

FIG. 5 shows an area 307 delineated by line 309 that is exposed by, for example, etching, through the first deposited insulating layer and thermal oxide layer to expose a broad area of the emitter. Similarly, an area 306 delineated by line 310 is etched to expose a broad area of the base. Similarly, said insulating layers are removed to expose an area 308 of the guard ring.

Figure 6:
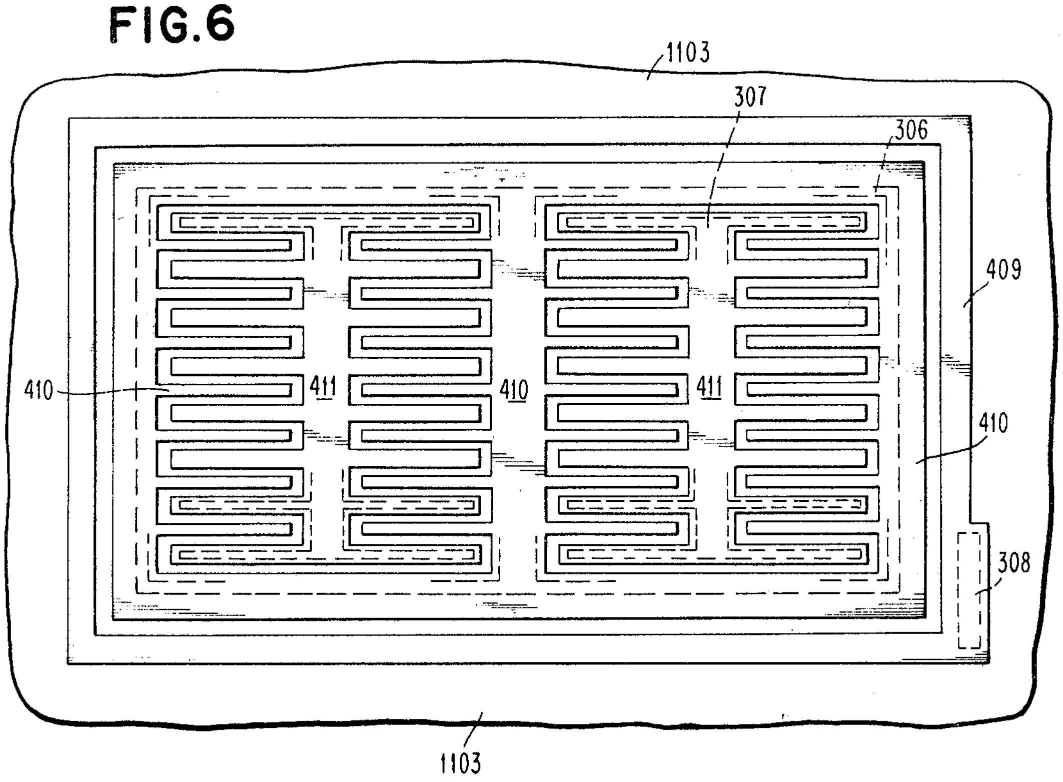

Referring to FIG. 6, a current-distributing metallization layer, such as aluminum, is deposited in the area 411 over the emitter region, in the area 410 over the base region, and area 409 over the guard ring. By reference to the exposed emitter area 307, and exposed base area 306, it is clear that the current-distributing metallization layer contacts the emitter and base respectively, and overlaps onto the first deposited insulating layer. However, the current-distributing metallization layer over the emitter regions are electrically discontinuous from the current-distributing metallization layer over the base region. Further insulating layers, to be deposited in the steps that follow, serve as insulating and migration barriers between adjacent metallization areas. This metallization layer, and successive metallization layers, may be deposited by any well known technique such as sputtering, vapor deposition, etc., over the entire area of the substrate and etched to final configuration, or may be deposited through masks directly to final configuration. If aluminum is used as the current-distributing metallization layer, a thickness of 6,000 angstroms is desirable. Area 410 overlaps the collector-base junction, completely surrounding the base area and forming what is called an "extended base" electrode, which suppresses surface breakdown. Area 409 overlaps to the inside of the entire guard ring and forms what is called a "field relief electrode." The extended base electrode and field relief electrodes are both known in the art and need not be discussed here. The invention may be practiced without the incorporation of either electrode; however, the use of the aforementioned electrodes imposes restrictions leading to the need for the disclosed multilevel structure of this invention.

Figure 7:
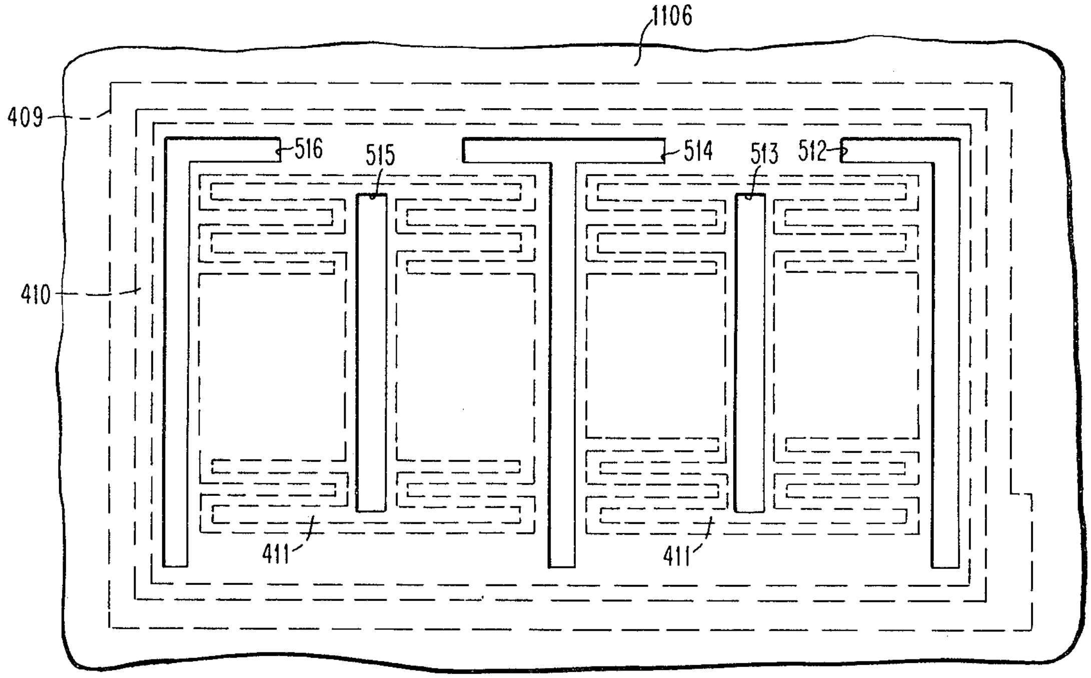

Next, a second deposited insulating layer, of, for example, $SiO_2$, to a thickness of approximately 1.5 microns, is deposited over the first side of said substrate. Referring to FIG. 7, areas 512, 513, 514, 515, and 516 are exposed through the second deposited insulating layer to expose large portions of the emitter current-distributing metallization layer, at 513, 515, and of the base current-distributing metallization layer 512, 514, 516. Then, in FIG. 8, another metallization layer, known as the second metallization layer 617, 618, 619, is deposited over the areas exposed through the second deposited insulating layer to contact the current-distributing metallization layers at 512, 513, 514, 515, and 516. This second metallization layer may be, for example, aluminum, to a thickness of 10,000 to 12,000 angstroms. It is clear that the area 513, 515, over the central I-bar of the multiple finger I-comb emitter configuration allows a large area contact to the emitter current-distributing metallization layer. The same is true of the large exposed areas to the base current-distributing metallization layer, at 512, 514, and 516.

Figure 9:
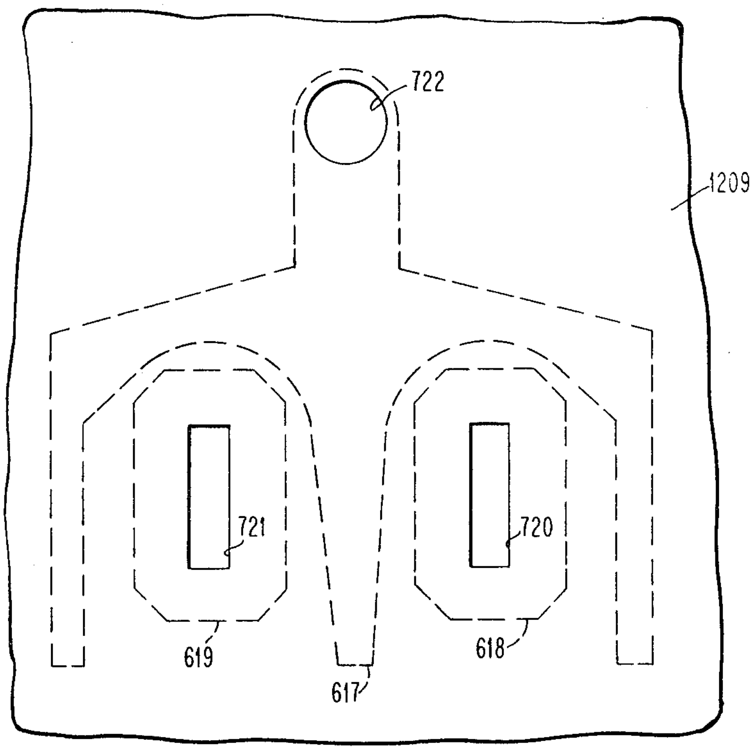

Next, a third deposited insulating layer is placed over the first side of said substrate. This layer, which preferably is of the same material as the prior insulating layers, here $SiO_2$, is approximately 2 to 2.2 microns thick. Next, in FIG. 9, areas 720, 721, 722, in the second metallization layer 617, 618, 619, are exposed through openings in the third deposited insulating layer. In FIG. 10, a third or external contact, metallization layer is placed at areas 823, 824, 825, over the openings in the third deposited insulating layer to make contact with the second metallization layer, This third, or external contact, metallization layer must be compatible with an external contact lead which will be made to the device at these contact points. While it may be preferable, for purposes of galvanic corrosion, to utilize again the same material as used in the preceding metallization layers, we prefer to use as the external contact metallization layer a multi-layer comprising a layer of chromium, followed by a layer of nickel or copper, followed by a layer of gold, upon which is deposited a thin layer of solder. Referring to FIG. 11, the areas delineated by lines 926, 927, and 928 show the position that a nickel-coated copper ball, for example, will occupy when placed upon the third, or contact metallization, layer (the multi-layer above) and attached thereto by solder reflow techniques. These ball contacts, when reflowed to circuit lines upon a carrier substrate, serve as the external contact means to the device.

FIG. 12 shows a partial overlay of FIGS. 3–11, showing their relationship to the whole. Each area is numbered as it appears in the preceding figures.

Figure 8:
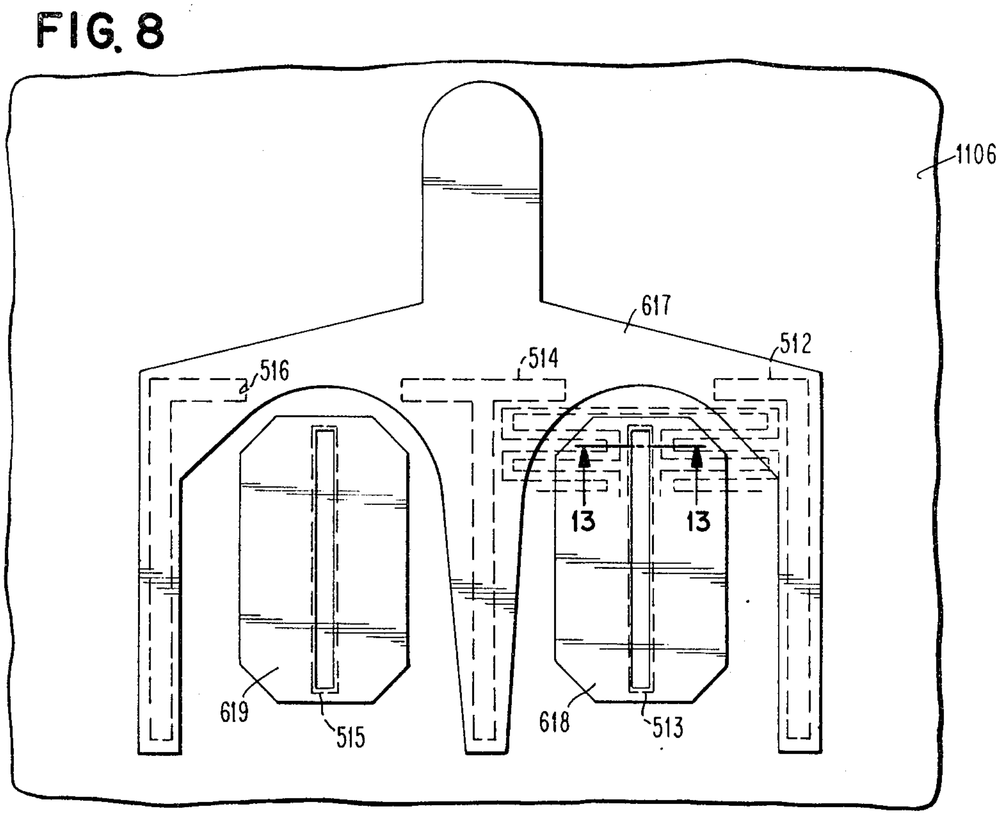
Figure 13:
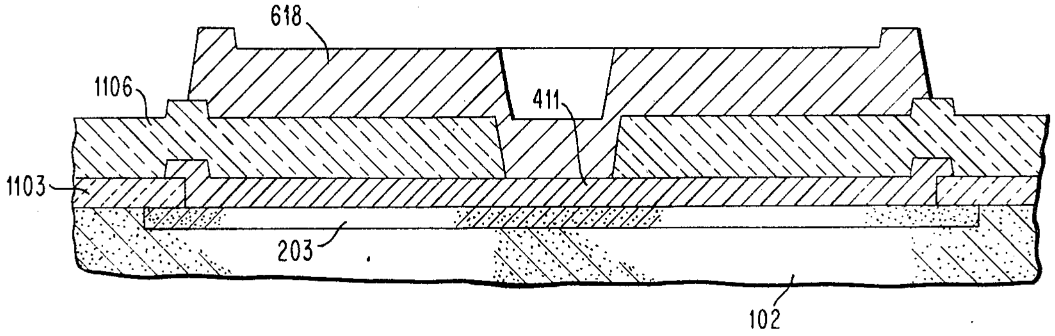
FIG. 13 represents a planar view of the substrate after the step represented in FIG. 6 above, taken across a lateral section of the multiple-finger I-comb emitter portion of said substrate.

FIG. 13 shows a planar view of part of the structure taken through an area 11—11 of FIG. 8, that is, after the second metallization layer has been deposited. This cross-section shows the I-bar section and a pair of emitter fingers of the emitter 203 diffused within the base 102. The current-distributing metallization layer 411 is shown contacting emitter area 203. The insulating layer 1103 is thermally grown oxide with the first deposited insulating layer thereon.

A second metallization layer 618 is shown contacting the current-distributing metallization layer 411 through an opening in the second deposited insulating layer 1106.

Figure 14:
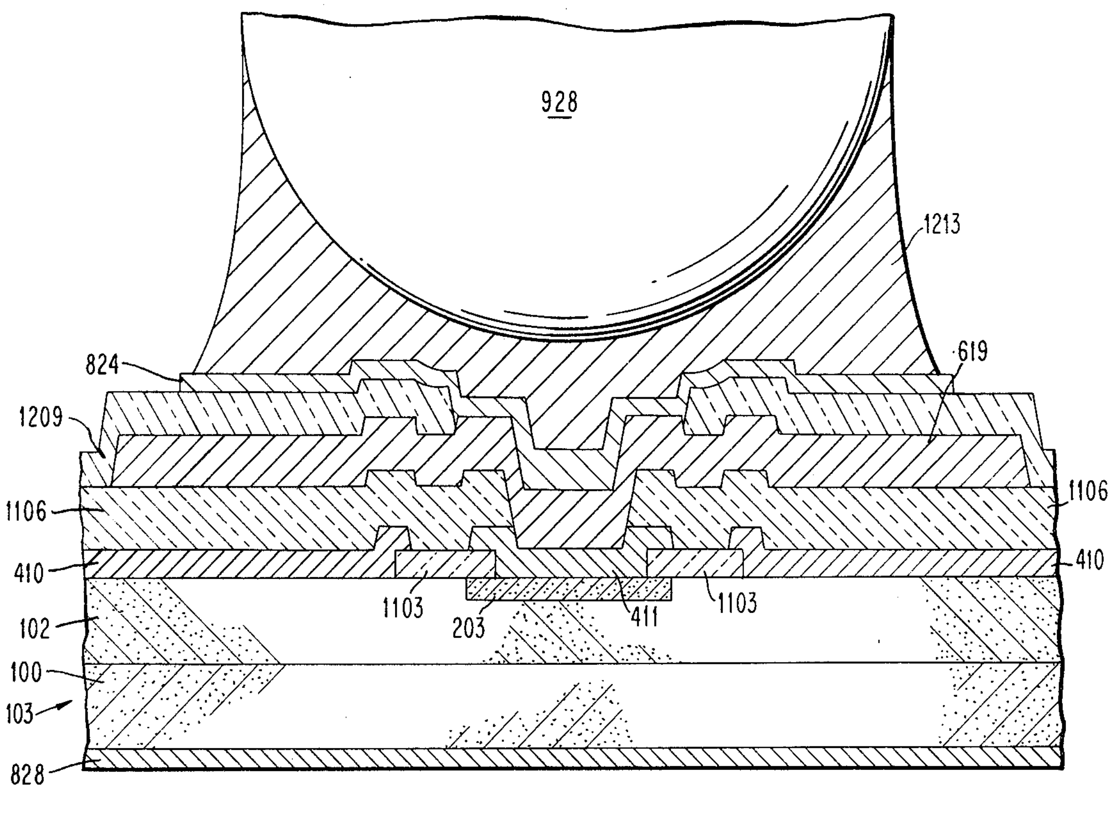
FIG. 14 represents a cross-section of said substrate after the step shown in FIG. 9 above taken across a lateral section of the multiple-finger I-comb and base finger portion of the base within the substrate.

FIG. 14 shows a planar view of one contact area of the device of this invention, including the ball contacts previously mentioned, taken through a section 12—12 shown in FIG. 12. Shown is the semiconductor substrate 103, epitaxial layer 100 into which is diffused the base region 102, into which is diffused emitter region 203, this view showing part of the I-bar area of said emitter region and base contact fingers. A current-distributing metallization layer 411, 410 contacts the emitter region 203, and fingers of the base region 102 through the insulating layer 1103, which is thermally grown oxide with the first deposited layer thereon. A second metallization layer 619 contacts the emitter current-distributing metallization layer 411 through openings in the second deposited insulating layer 1106. A third, or external contact, metallization layer 824 contacts the second metallization layer 619 through openings in the third deposited insulating layer 1209. Layer 824 is depicted as a single material layer, for simplicity, although in this invention it is preferable though not necessary to use a tri-layer of chrome, nickel or copper, and gold. A solder layer 1213, preferably of a lead-tin alloy, is deposited over the third, or external contact, metallization layer 824. A nickel-coated copper ball 928 is then reflowed to the solder layer 1213. Upon the underside of the substrate, a layer 828 of chrome, nickel or copper, and gold, is deposited, preferably prior to opening the holes in the third insulating layer 1209.

Referring back to FIG. 12, external electrical contact to the base region is thus made at region 926, which has been removed from directly above the base area to an unused portion of the substrate. Contact to the emitter areas is made at regions 927 and 928 and shorted out through external circuitry. Thus, two contacts to the collector is made on the underside of the substrate through the deposited chrome, copper or nickel, and gold layer 828 shown in FIG. 14.

Figure 2:
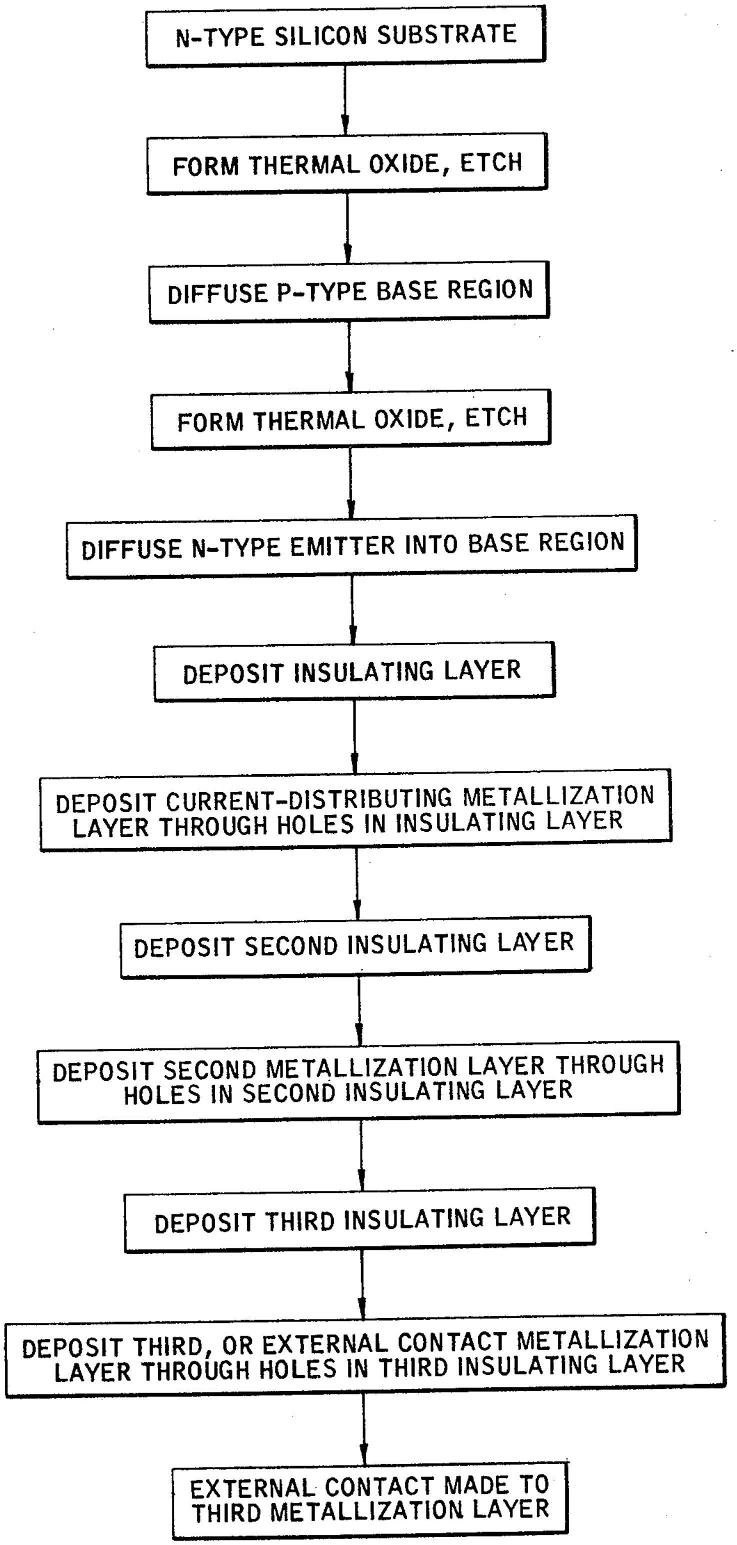
FIG. 2 represents a block diagram representation of the step by step method of this invention.

FIG. 2 shows a block diagram of the individual steps in the making of this device.

Figure 1A:
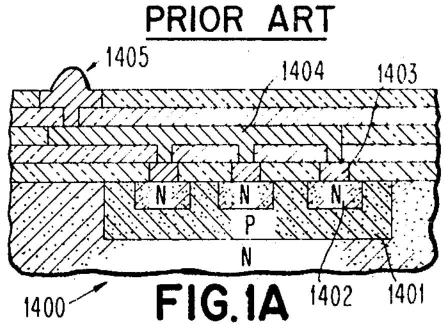
FIG. 1 represents a prior art metallization contact structure, and a metallization contact structure of this invention.
Figure 1B:
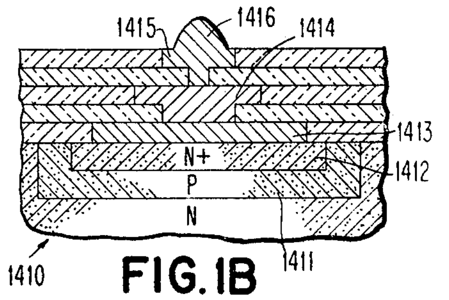

FIG. 1 illustrates the difference in electrical path, from the viewpoint of current densities, between the prior art methods and the method and structure of this invention. In FIG. 1*a*, a prior art structure is shown whereby active area 1402 within area 1401 of semiconductor substrate 1400, have deposited thereon a first metallization layer 1403, such as an aluminum film. A second metallization layer 1404 such as an aluminum film is deposited and contacts said first metallization layer. (For clarity, no insulating layers are shown in the representations of FIGS. 1*a* and 1*b*.) A final contact is made to film 1404 by contact 1405. A major problem, solved by the structure of FIG. 1*b*, is that high current densities of film 1404 leading to the shown emitter terminal cause electromigration of aluminum and ultimate failure by an open circuit.

In FIG. 1*b*, a semiconductor substrate 1410 is shown having a base region 1411 and an emitter area 1412 diffused therein. Contacting the emitter area 1412 is a current-distributing metallization layer 1413, for example of aluminum, the layer extending over a large area of emitter 1412. Contacting layer 1413 is a second metallization layer 1414. Contacting layer 1414 is a third, or external contact, metallization layer 1415, with a solder connection 1416, for example, thereon. In this structure, high currents are restricted to areas where the current-distributing metallization layer 1413 contacts emitter area 1412. Should an open occur in layer 1413, the current is merely shunted by the highly doped, low resistivity, emitter layer 1412 around the open, and then back into layer 1413 again.

Thus, the following may be clearly seen from the device as illustrated in FIG. 12 and FIG. 14. With two contacts to the emitter region centrally located with respect to the multiple-finger I-comb patterns, current densities are reduced to relatively low values. The multiple-finger I-comb pattern of the emitter, enclosed entirely within the base region, allows a high perimeter/area junction ratio. Successive metallization contacts from areas 513, to 720, to 823, for example, on the emitter, provide large cross-sectional areas and allow high current carrying capacity for the device. Further, the current-distributing metallization layer covers a very large area of the emitter region, extending into the finger areas; current is distributed throughout the entire layer via a low resistance path, the current-distributing metallization layer. Should parts of this metallization layer fail, for example upon the finger areas, the n+ region of the emitter diffusion would carry the current itself, shunted around any open in an aluminum region such as could be caused by electromigration effects. The slight increase in resistance in one finger is not observable externally because of the redundancy built in by the multiple fingers. The massive current-distributing metallization layer over so much of the emitter area effectively reduces the current density at the contact area leading to the final contact 927.

Tests of this device in comparison with a similar device but wherein external contact is made to a second metallization layer outside of the active device area, wherein the emitter current is distributed primarily in the second metallization layer, has shown that current density in the emitter lands upon an insulator has been reduced from greater than $2\times10^6$ amps per square centimeter to a maximum of $1\times10^5$ amps per square centimeter. Current densities of $10^6$ amps per square centimeter cause rapid failure of aluminum lands over an insulator. This test was done on a sample similar to that shown in FIGS. 3–14, for a total of 1.2 amps emitter current in the transistor with maximum current density occurring in the current-distributing metallization layer at the base of an emitter finger shown in FIG. 13. One micron and .6 micron thickness of metallizations were used respectively for the second metallization layer and the current-distributing metallization layer. Further, a vertical rather than horizontal path distributes most of the current to the multiple array of narrow emitter fingers.

The final structure, as shown in FIG. 14, also provides protection against corrosion problems. The second metallization layer and the three layers of insulator act as buffers to relieve stress should a crack occur in the third deposited insulating layer. The width of the second contact metallization layer is such as to sufficiently extend beyond the third, or external contact, metallization layer so as to prevent any contact via galvanic corrosion between the base portion 410 (FIG. 14) of the current-distributing metallization layer and the third, or external contact, metallization layer 824 should a crack occur in the insulating layers. Further, the thermal oxide insulating layers between the current-distributing metallization layer over the emitter and the same layer over the base, coupled with the first and second deposited insulating layers, prevents migration under bias of these metals, which would result in a short circuit.

This structure also provides a method as illustrated by FIG. 1*b* for distributing current to provide an alternate, shunting current path in high current density areas, where no such alternate paths exist, of acceptable values.

The device shown in FIG. 12 has shown applicability as a high power, high speed, high voltage device, carrying 1.2 amps of current, and capable of acting as a high speed switching device operating in the 10 nanosecond region.

This device has also been tested under high humidity-temperature-stress conditions and has operated successfully for over 4,500 hours at 150° C. and 1.2 amperes of emitter current, wherein similar devices without the current-distributing scheme utilized here have failed in less than 1,000 hours, due to electromigration of second level aluminum metallization layers.

While the general method for making this device has been previously discussed, a particular method of making this device has been found to be preferable within the general method as outlined previously. This method is illustrated in the following example.

EXAMPLE I

The starting material is an n+ silicon substrate with an n-type epitaxial layer formed thereon, on the first side of said substrate. The substrate is thermally oxidized by heating successively in oxygen, steam, and oxygen, at essentially 1000° C. The thermal oxide formed is then etched to expose the base diffusion pattern. A standard photoresist technique is utilized using a buffered hydrofluoric acid etch to remove the thermal oxide from the base diffusion area. The base diffusion is carried out by sealing in a capsule the silicon substrate in contact with a boron-silicon source powder, and heating the capsule to a temperature of between 1100–1500° C., between 1 and 2 hours to effect a diffusion of boron into the substrate. The boron is then further diffused into the substrate concurrent with re-oxidation of the exposed base surface of the substrate by heating in an oxidation furnace at essentially 1150° C. for 30 minutes to one hour, depending upon the depth of the desired diffusion. Then, using standard photo-resist techniques, and standard etching techniques as before, the emitter area is exposed through the thermal oxide layers. To form the emitter area, the substrate is then placed in an open tube at 970° C. for approximately 2 hours, while in contact with vapor from a $POCl_3$ source to cause a phosphorus diffusion into the wafer to form the emitter area. The emitter is in the I-comb multiple-finger configuration.

Then, a thin quartz layer is placed upon the first side of the substrate by use of RF sputtering with magnetic field constraint. The wafer is held at a temperature of less than 400° C., and preferably at about 250° C. for a time sufficient to deposit approximately a 1500 angstrom layer of $SiO_2$. The magnetic field constraint allows deposition of the $SiO_2$ at a low temperature. This results in a superior quartz film, as less strain is then present in the film. It is known that stressed or strained films often present difficulties in etching, where the stressed area etch more rapidly than non-stressed areas.

The first side of the substrate is then etched in the same manner as the prior etchings, to expose an area for deposition of the current-distributing metallization layer. This is done by evaporation, preferably of aluminum, for a time necessary to deposit essentially a 6,000 angstrom thick film, with the substrate at a temperature of about 250° C. A temperature of 250° C. or less is desired so as to maintain the aluminum film in a state that allows easy etching for further processing. At higher temperatures, the aluminum will further alloy with the underlayers, causing difficulty in etching, and a different structure. The current-distributing metallization layer pattern is then etched by conventional techniques to the desired pattern. The entire substrate is then sintered at approximately 450° C. for 15 minutes in dry nitrogen. This sintering gives bettter adhesion of the aluminum layer with the previously deposited insulating layer. At temperatures greater than 450° C., more alloying than desirable occurs between the aluminum film and the quartz layers. A temperature range of between 350–450° C. produces sufficient adhesion.

Next is deposited a second insulating layer of $SiO_2$, in the same manner as before, except that the time is held for a length sufficient to allow a deposition to a thickness of about 1.6 microns. Openings in this second insulating layer are made by photoresist and etching techniques in the same manner as above. Then, a second metallization layer of aluminum is deposited, by the same evaporation techniques as before, to a thickness of about 12,000 angstroms. The second metallization layer pattern is etched as before, and then sintered for adhesion, as before.

Next, a third insulating layer is deposited in the same manner as above, but to a thickness of about 2.2 microns. After this step, back-side metallurgy is deposited on the second side of the substrate. This is done by first placing the substrate in a vacuum system, and utilizing DC sputter cleaning to clean the surface. Then a layer comprising a tri-layer of chromium-copper-gold is deposited on the wafer, the wafer being held at a temperature of between 200–300° C., preferably 250° C., to maximize adhesion and minimize the stress in the layers upon the wafer. The chromium and copper evaporations are overlapped.

On the first side of the substrate, terminal via holes are now etched through the third insulating layer, in the same manner as before. The first side of the substrate is then cleaned by RF reverse sputtering techniques.

Then, the third metallization layer of chromium, copper or nickel, and gold is evaporated through a metal mask on to the first side of the substrate. The substrate is held at a temperature not exceeding 250° C., for the same reasons as stated previously. The use of the metal mask eliminates the need for any etching step. Then, also evaporated through a mask, is the final tin-lead overlay, the substrate being maintained at a temperature of less than 200° C. External contact, such as by the use of nickel-plated copper balls, may then be made to the third metallization layer, by techniques well known in the art.

While the method detailed above is a preferred method, resulting in a device of extreme reliability, it is clear that satisfactory devices within the method and structure of this invention may be made by less complex methods, as discussed in the general method of the manufacture of this device.

It is clear that while the method and device of this disclosure find particular applicability in high speed switching devices such as that discussed above, wherein the multiple-finger I-comb array is used, the combination of contact metallization comprising a current-distributing metallization layer, with two additional metallization layers, interspersed with insulating layers as described above, may be used for making contact to a great variety of semiconductor devices, such as diodes, or multiple junction transistors, or for reliable corrosion resistance contacts in general. While contact to the collector of the device shown in FIG. 12 was made to the underside of the substrate, it is equally clear that a similar contact structure as that to the emitter and base regions could be utilized successfully for the collector region contact. Thus, the devices made utilizing this invention are relatively free of galvanic corrosion problems, crack propagation, due to both stress relief and the numerous interfaces through which a crack would have to propagate, and eliminate electromigration "failures" by shifting high current densities from lands over an insulator to lands over a diffused silicon area, thus achieving redundant current paths and "fail-safe" operation. Further, no costly processing steps are involved in the manufacture of this device, making it economically feasible as a production item.

While the invention has been particularly shown and described with reference to the preferred embodiments thereof, it will be understood by those skilled in the art that various changes in form and details may be made therein without departing from the spirit and scope of the invention.

What is claimed is:

1. The method of producing a semiconductor device including contact metallization thereon comprising the steps of:

forming upon the first side of a semiconductor substrate of a significant impurity type at least one area thereon of a significant impurity type opposite that of said substrate, forming at least a first and second discrete region separated by a junction interface;

forming a first electrically insulating layer upon said first side of said substrate, said insulating layer overlapping and conforming to the shape of said junction interface, not covering the greater areas of said first and second discrete regions;

forming a current-distributing metallization layer upon the exposed areas of said first and second discrete regions, overlapping said first electrically insulating layer, said metallization layer over each said region being electrically discontinuous from said metallization layer over each other of said regions;

forming a second electrically insulating layer having holes therein over said first side of said substrate, said holes exposing an area of said current-distributing metallization layer upon said regions, said holes located over each of said discrete regions, said holes being less in area than the area of said current-distributing metallization layer;

forming a second metallization layer upon said second insulating layer, electrically contacting said current-distributing metallization layer through said holes located in said second insulating layer, said second metallization layer over each discrete region being electrically discontinuous from said second metallization layer over said other region.

2. The method of claim 1 including the additional steps comprising:

forming a third electrically insulating layer having holes therein over said first side of said substrate, exposing an area of said second metallization layer through said holes, said holes being less than and within the area covered by said second metallization layer within each of said discrete regions on said substrate;

forming a third metallization layer upon said third electrically insulating layer, electrically contacting said second metallization layer through said holes in said third electrically insulating layer, said third metallization layer extending onto said third electrically insulating layer, said third metallization layer upon each of said regions being electrically discontinuous from each third metallization layer upon each other of said regions;

said device thus made being electrically connectable via said third metallization layers to outside connecting means.

3. The method of claim 2 wherein the forming of at least one area upon said substrate, of a significant impurity type opposite that of said substrate, is formed in the shape of a multiple-finger I-comb.

4. The method of claim 1 wherein the forming of at least one area upon said substrate, of a significant impurity type opposite that of said substrate, is formed entirely within said first region.

5. The method of claim 1 wherein the forming of said third layer comprises forming at least two different discrete metal layers.

6. The method of claim 3 wherein the forming of said second and said third metallization layers contacting said multiple-finger I-comb regions is formed centrally located with respect to said I-comb regions.

7. The method of claim 1 wherein said substrate is of silicon of an n-type significant impurity type, having an n-type significant impurity type silicon epitaxial layer thereon said first side of said substrate, and forming a p-type significant impurity type base layer on said epitaxial layer, and forming an n-type significant impurity type emitter layer within the area of said base layer.

8. The method of claim 3 wherein said forming of said second metallization layers over said I-comb regions comprises forming said second metallization layer larger than and extending beyond said third metallization layer over said region.

9. The method of claim 2 wherein said second and third insulating layers are formed upon said substrate comprising the step of depositing said layers by the method of RF sputtering with magnetic field constraint.

10. The method of claim 2 wherein said substrate is maintained at a temperature of less than substantially 400° C.

11. The method of claim 1 including the steps of, after forming said current-distributing metallization layer, and after forming said first metallization layer, sintering said substrate at a temperature of between essentially 350–450° C. in a protective atmosphere for a time of essentially 15 minutes.

12. The method of claim 1 wherein during the forming of said current-distributing metallization layer and said first metallization layer, said metallizations are formed by the steps comprising vacuum deposition of said layers while said substrate is maintained at a temperature of less than substantially 250° C.

13. The method of claim 2 wherein during said forming of said third metallization layer, said substrate upon which said third metallization layer is deposited is maintained at a temperature of less than substantially 250° C.

14. A semiconductor device including contact metallization thereon comprising:

a semiconductor substrate of a significant impurity type, having formed on its first side at least one area thereon of a significant impurity type opposite that of said substrate, forming at least a first and second discrete region separated by a junction interface;

a first electrically insulating layer formed upon said first side of said substrate, said insulating layer overlapping and conforming to the shape of said junction interface, not covering the greater areas of said first and second discrete regions;

a current-distributing metallization layer formed upon said first and second discrete regions, overlapping said first electrically insulating layer, said metallization layer over each said region electrically discontinuous from said metallization layer over each other of said regions;

a second electrically insulating layer having holes therein, formed over said first side of said substrate;

a second metallization layer upon said second insulating layer, electrically contacting said current-distributing metallization layer through said holes located in said second insulating layer, said holes located over each of said discrete regions, said holes being less in area than the area of said current-distributing metallization layer, said second metallization layer over each discrete region being electrically discontinuous from said second metallization layer over said other regions;

a third electrically insulating layer having holes therein formed over said first side of said substrate;

a third metallization layer formed upon said third electrically insulating layer, electrically contacting said second metallization layer through said holes in said third electrically insulating layer, said holes being less than and within the area covered by said second metallization layer within each of said discrete regions on said substrate, said third metallization layer overlapping said third electrically insulating layer, said third metallization layer upon each of said regions being electrically discontinuous from each third metallization layers upon each other of said regions;

external contact being made to said third metallization layers.

15. The device of claim 14 wherein at least one area upon said substrate, of a significant impurity type opposite that of said substrate, is of a multiple-finger I-comb shape.

16. The device of claim 14 wherein at least one area upon said substrate, of a significant impurity type opposite that of said substrate, is located entirely within said first region.

17. The device of claim 14 wherein at least one area upon said substrate, of a significant impurity type opposite that of said substrate, is two such areas of a multiple-finger I-comb shape, located entirely within said first region.

18. The device of claim 14 wherein said second and third metallization layers contacting said multiple-finger I-comb regions are centrally located with respect to said I-comb regions.

19. The device of claim 14 wherein said third metallization layer comprises at least two different metal layers.

20. The device of claim 14 including on the second side of said substrate a contact metallization layer.

21. The device of claim 14 wherein said substrate is of silicon with an n-type significant impurity type, having an n-type significant impurity type silicon epitaxial layer thereon a first side of said substrate, a p-type significant impurity type base layer included within the area of said epitaxial layer, and an n-type significant impurity type emitter layer included within the area of said base layer.

22. The device of claim 21 wherein said emitter layer is of at least one multiple-finger I-comb shape.

23. The device of claim 14 wherein said second metallization layer over said I-comb regions is larger than and is extended beyond said third metallization layer over said region.

24. The device of claim 21 wherein said n-type significant impurity type is a p-type significant impurity type, and said p-type significant impurity type is an n-type significant impurity type.

References Cited

UNITED STATES PATENTS

| | | | |
|---|---|---|---|
| 2,816,847 | 12/1957 | Shockley | 148—1.5 |
| 3,124,640 | 3/1964 | Armstrong | 317—234 X |
| 3,214,652 | 10/1965 | Knowles | 317—235 |
| 3,225,261 | 12/1965 | Wolf | 317—235 X |
| 3,287,612 | 11/1966 | Lepselter | 317—235 |
| 3,304,595 | 2/1967 | Sato et al. | 317—235 X |
| 3,309,585 | 3/1967 | Forrest | 317—234 |
| 3,325,706 | 6/1967 | Kruper | 317—235 |

JOHN W. HUCKERT, Primary Examiner

R. F. POLISSACK, Assistant Examiner

U.S. Cl. X.R.

29—577, 589; 317—235